United States Patent
Reible

(10) Patent No.: US 9,002,288 B1
(45) Date of Patent: Apr. 7, 2015

(54) CONFIGURABLE SHIELDED ENCLOSURE WITH SIGNAL TRANSFER ELEMENT

(71) Applicant: James Patrick Reible, Pomona, CA (US)

(72) Inventor: James Patrick Reible, Pomona, CA (US)

(*) Notice: Subject to any disclaimer, the term of this patent is extended or adjusted under 35 U.S.C. 154(b) by 0 days.

(21) Appl. No.: 13/750,976

(22) Filed: Jan. 25, 2013

Related U.S. Application Data

(60) Provisional application No. 61/590,716, filed on Jan. 25, 2012.

(51) Int. Cl.
*H04B 17/00* (2006.01)
*H05K 9/00* (2006.01)
*A47B 81/06* (2006.01)
*G06K 19/073* (2006.01)

(52) U.S. Cl.
CPC .............. *A47B 81/06* (2013.01); *H05K 9/0018* (2013.01); *G06K 19/07318* (2013.01); *H05K 9/0009* (2013.01); *H05K 9/0049* (2013.01); *G06K 19/07327* (2013.01); *H05K 9/0045* (2013.01)

(58) Field of Classification Search
CPC . H05K 9/0009; H05K 9/0018; H05K 9/0015; H05K 9/0043; H05K 9/0045; H05K 9/0049; H05K 9/0056; G06K 19/073; G06K 19/07327; H01Q 1/526
USPC ......... 455/90.3, 575.8, 67.12, 7, 15; 174/377, 174/379, 383
See application file for complete search history.

(56) References Cited

U.S. PATENT DOCUMENTS

| | | | |
|---|---|---|---|
| 5,436,803 A | | 7/1995 | Annis et al. |
| 6,094,361 A | * | 7/2000 | Batten et al. ................. 361/816 |
| 6,097,613 A | * | 8/2000 | Batten et al. ................. 361/816 |
| 6,147,879 A | * | 11/2000 | Batten et al. ................. 361/800 |
| 6,657,214 B1 | | 12/2003 | Foegelle et al. |
| 7,512,430 B2 | | 3/2009 | Nakamura |
| 7,880,083 B2 | * | 2/2011 | Livne .............................. 174/50 |
| 7,991,439 B2 | | 8/2011 | Mao et al. |
| 8,242,914 B2 | * | 8/2012 | Matityaho et al. ......... 340/572.7 |
| 8,387,790 B2 | * | 3/2013 | Conner et al. ................ 206/320 |
| 2003/0057131 A1 | * | 3/2003 | Diaferia ........................ 206/719 |
| 2003/0081907 A1 | | 5/2003 | Malagrino, Jr. et al. |

(Continued)

FOREIGN PATENT DOCUMENTS

| | | |
|---|---|---|
| EP | 1 715 353 | 10/2006 |
| JP | 01-283999 | 11/1989 |

(Continued)

OTHER PUBLICATIONS

Pavlus, John; "Silence Smart Phones at Thanksgiving Dinner with a Foldable Faraday Cage"; as downloaded from: http://www.technologyreview.com/view/421768/silence-smart-phones-at-thanksgiving-dinner-with-a-foldable-faraday-cage/; Nov. 21, 2010; pp. 2.

*Primary Examiner* — Duc M Nguyen

(74) *Attorney, Agent, or Firm* — Knobbe Martens Olson & Bear LLP

(57) ABSTRACT

An enclosure that has an interior space sized to receive a portable electronic device. The enclosure has a shielding layer that can shield and prevent communications between the interior space and the outside world in a first configuration. In a second configuration, communication is allowed. A signal transfer element is attached to the enclosure housing that can be moved between an isolation configuration and a communication configuration.

29 Claims, 9 Drawing Sheets

(56) References Cited

U.S. PATENT DOCUMENTS

| | | | |
|---|---|---|---|
| 2007/0259704 A1* | 11/2007 | Jung | 455/575.8 |
| 2008/0096494 A1* | 4/2008 | Chan et al. | 455/90.3 |
| 2008/0212303 A1* | 9/2008 | Farnworth et al. | 361/816 |
| 2008/0309565 A1* | 12/2008 | Villarroel et al. | 343/703 |
| 2009/0045960 A1* | 2/2009 | von Gutfeld | 340/572.3 |
| 2009/0146862 A1* | 6/2009 | Malone | 342/1 |
| 2009/0156118 A1* | 6/2009 | Schadler | 455/25 |
| 2010/0156642 A1* | 6/2010 | Lindsay et al. | 340/572.7 |
| 2010/0240421 A1 | 9/2010 | Sekora et al. | |
| 2010/0267431 A1 | 10/2010 | Fratti et al. | |
| 2011/0014863 A1* | 1/2011 | Foster | 455/1 |
| 2011/0309937 A1* | 12/2011 | Bunza et al. | 340/573.5 |
| 2012/0228020 A1* | 9/2012 | Winch et al. | 174/378 |

FOREIGN PATENT DOCUMENTS

| | | |
|---|---|---|
| JP | 03-276800 | 12/1991 |
| JP | 09-318689 | 12/1997 |
| JP | 2000-059256 | 2/2000 |

* cited by examiner

CONFIGURABLE SHIELDED ENCLOSURE WITH SIGNAL TRANSFER ELEMENT

CROSS-REFERENCE TO RELATED APPLICATIONS

This application claims the benefit of U.S. provisional application No. 61/590,716 entitled CONFIGURABLE SHIELDED ENCLOSURE WITH SIGNAL TRANSFER ELEMENT filed Jan. 25, 2012.

BACKGROUND OF THE INVENTION

1. Field of the Invention

The present invention relates to a shielded enclosure that can contain a transmitting and receiving device and, in particular, concerns a shielded enclosure that can selectively allow communications to and from a transmitting and/or receiving electronic device such as a cellular telephone, smart phone etc.

2. Description of the Related Art

Cellular telephones, smart phones, tablets and other similar portable electronic devices have become ubiquitous in recent years. The functionality of these portable devices have also increased very dramatically in recent years. For example, these portable electronic devices can incorporate GPS functionality where the device is receiving information that indicates the exact whereabouts of the device. This information can be used to track the location of the device by sending an appropriate query to the device.

Even devices without GPS functionality can be tracked to very specific locations. For example, if the device is connected via a cellular network, the device is continuously communicating with the network. These communications with the network are often detected by multiple antennas and triangulation strategies can be used to determine the location of the device to a very high degree of accuracy. These types of devices are often capable of providing location information even when the device has been turned off as the processors within the device may still operate and the antennas and other inputs of the device may still be operable.

However, owner's of these devices may not wish to have the location of the device to be continuously available for monitoring. Having the location information being continuously available may result in unwarranted invasions of the privacy of the owner of the device as someone else may able to use the location information to determine the location of the device and, thus, the location of person owning the device. Moreover, information that is stored on a portable electronic device may also be accessed by unscrupulous entities when the device is actively transmitted and receiving. This information can include sensitive personal information such as financial information.

Hence, there is a need for a simple way of permitting an owner of a portable electronic device to be able to selectively prevent or otherwise inhibit communication with the device to thereby inhibit the determination of the location of the device or unauthorized access to the device. To this end, there is a need for some type of carrying device that can selectively and effectively shield the device from communications with the outside world.

SUMMARY OF THE INVENTION

A configurable enclosure that allows the user to select whether the enclosed device is able to transmit and receive signals (communication enabled—configuration one) or is shielded and is no longer able to transmit or receive signals (communication disabled—configuration two). This is accomplished by either exposing a signal-transfer element to signals external to the shield (communication enabled—configuration one) or enclosing or disabling the signal-transfer element within the shield (communication disabled—configuration two).

In one embodiment, the signal-transfer element is designed as a flap which when positioned external to the shield enables communication with the contained device (configuration one) and when positioned within the shield, disables communication with the contained device (configuration two).

In an alternative embodiment, one or more narrow-band and/or filtered signal-transfer elements are employed to allow greater control of selecting which signals can reach the contained device.

In an alternative embodiment, the signal-transfer element is extendable external to the shield, enabling communication with the contained device (configuration one), and retractable being effectively contained within the shield, disabling communication with the contained device (configuration two).

In this embodiment, the signal-transfer element is selected from the group containing wire, rod, tube, channel, etc.

In an alternative embodiment, one or more signal-transfer element(s) is/are positioned within an aperture contained within the shield, which can be exposed, by uncovering the aperture, enabling communication with the contained device (configuration one) or covered, blocking the aperture and completing the shield thereby disabling communication with the contained device (configuration two).

In an alternative embodiment, one or more signal-transfer element(s) is/are electromagnetically isolated from the shield enabling communication with the contained device (configuration one) or electromagnetically connected to the shield thereby disabling communication with the contained device (configuration two).

The above embodiments define the signal-transfer element as being from the group including electromagnetically transmissive structures and antennas such as monopole, dipole, loop, patch, planar, fractal, etc.

In an alternative embodiment, the signal-transfer element transfers signals other than electromagnetic, such as light bands (UV through IR) through elements such as light-pipes, that when exposed external to the shield, enables communication with the contained device (configuration one) and when blocked or within the shield, disables communication with the contained device (configuration two).

In an alternate embodiment, the signal-transfer element is located external to the shield in the blocked configuration disabling communication with the contained device (configuration two) and introduced within the shield, enabling communication with the contained device (configuration one).

In an alternate embodiment, the signal transfer element is divided in two or more pieces, with at least one piece inside the shield and at least one piece outside the shield, so that when connected, it enables communication with the contained device (configuration one) and when disconnected, it disables communication with the contained device (configuration two).

Although the above contains many specificities, these should not be construed as limiting the scope of the invention but as merely providing illustrations of some of the alternate embodiments of this invention. For example, the signal-transfer element can have other shapes, such as circular, oval, trapezoidal, triangular, etc., based on the signal it must accommodate; the action required to expose the signal-transfer element could be accomplished in a variety of ways such as folding, sliding, bending, pivoting, extending; and the signals transferred may not be from the electromagnetic spectrum, i.e., sound, ultra-violet light, visible light, infra-red, heat and a variety of others. Thus, the scope of the invention should be determined by the claims and their legal equivalents, rather than by the examples given.

DETAILED DESCRIPTION OF THE PREFERRED EMBODIMENT

Figure 1A:
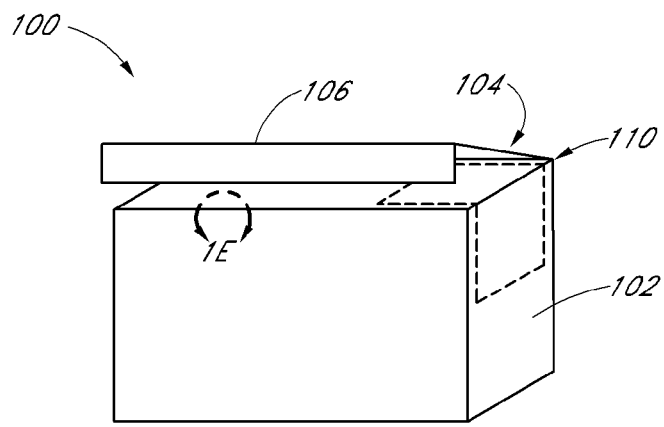
FIGS. 1A-1F are perspective and cross-sectional views of a first embodiment of a configurable shielded enclosure for use with personal electronic devices.

Reference will now be made to the drawings wherein like numerals refer to like parts throughout. Referring initially to FIGS. 1A-1D, a first embodiment of a configurable shielded enclosure 100 for use with a portable electronic device is shown. As shown, the enclosure 100 includes a housing 102 that defines an interior space 104 that is sized so as to receive a portable electronic device such as a cellular phone, smart phone etc. The shape and configuration of the housing 102 and the interior space 104 can vary without departing from the spirit or scope of the present invention.

As is also shown in FIGS. 1A-1D, the enclosure 100 includes a access port 106 or door 106 that is movable between an open configuration where the portable electronic device can be positioned within or removed from the interior space 104 and a closed configuration where the portable electronic device is secured within the housing 102.

Figure 1B:
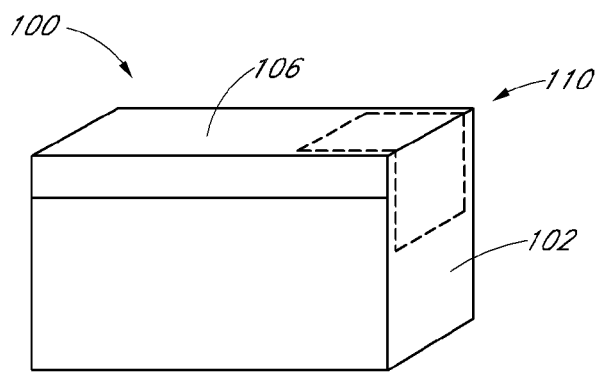
Figure 1C:
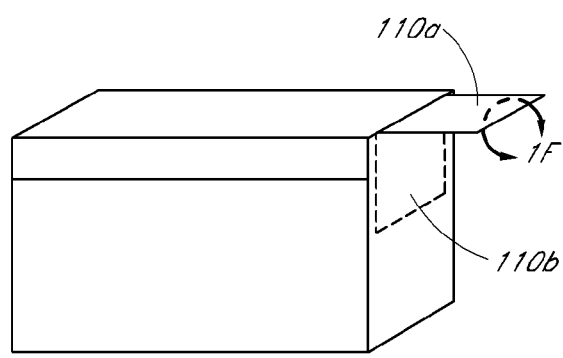
Figure 1D:
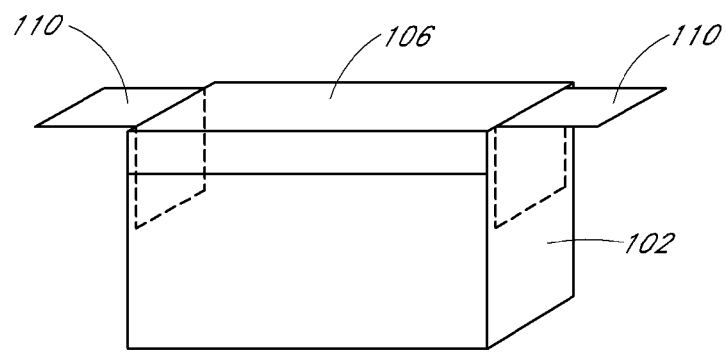

As is also shown in FIGS. 1A-1D, the enclosure 100 also includes a signal transfer element 110 that has a first component 110a that can be optionally positioned outside of the interior space 104 of the housing 102 or (FIG. 1C) or inside the interior space 104 of the housing 102 (FIG. 1B). The signal transfer element 110 also includes a interior component 110b that is fixed within the interior space 104 of the housing 102. In one embodiment, the signal transfer element 110 is an antenna that when the component 110a is positioned outside of the housing 102, the component 110a can receive electromagnetic signals such as cell phone or digital data signals and then transmit them into the interior space 104 of the housing 102 as a result of being connected to the interior component 110b. In one embodiment, the signal transfer element is wire, microstrip, or stripline. In another embodiment, the signal transfer element comprises an antenna selected from the group monopole, dipole, strip-line, or fractal.

In one non-limiting example, the signal transfer element 110 comprises one or more flexible layers of material, one of which being a metal layer that is suitable for reception and transmission of electromagnetic signals between the interior space 104 and the outside environment. More specifically, as shown in FIG. 1F, the signal transfer element may include an element layer 111 with two cover layers 113a, 113b. The element layer 111 is preferably a conductive layer such as a metal foil and the cover layers 113a, 113b can be any of a number of different types of layers that can be decorative and also protective of the metal foil layer. The cover layers 113a, 113b may be cloth, leather, plastic etc.

Figure 1E:
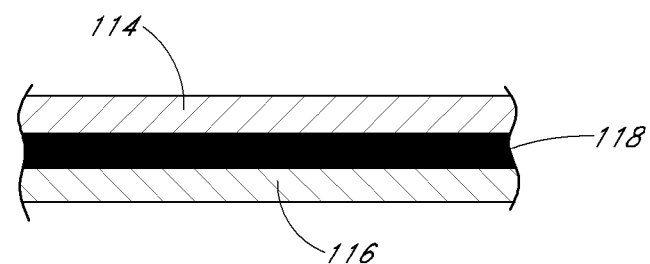
Figure 1F:
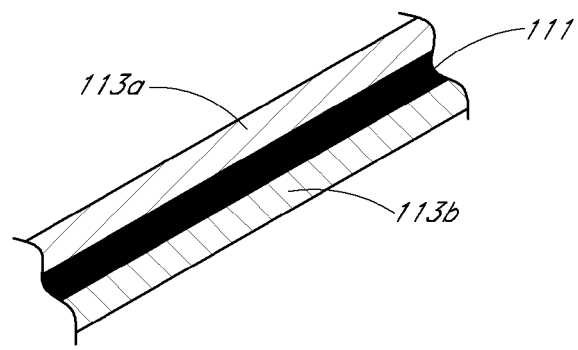

The housing 102 includes walls that have multiple layers as is illustrated in the cross-section of FIG. 1E. In the cross section the walls are generally comprised of an outer cover 114 and an inner liner 116 with a shield layer 118 interposed therebetween. The outer cover 114 can be any of a number of materials, including leather, plastic etc. that are sufficiently resilient to afford a level of protection of the shield layer 118 and electronic device. The inner liner 116 can also be any of a different types of materials such as fabric, plastic etc. that is suitable for providing a protective surface to receive the portable electronic device. The shield layer 118 is formed of a continuous conductive material, such as metal foil, that is preferably substantially continuous so as to form a faraday cage about the electronic device when the electronic device is positioned within the space 104 and the access port 106 is in the closed position. The inner liner 116 is also preferably electrically insulating so that the shield layer 118 is electrically isolated from the signal transfer element 110 so that the shield layer 118 can function as a faraday cage.

Thus, when the electronic device is in the interior space 104 and the access port 106 is in the closed position and the signal transfer device is retracted inside of the housing 102, the portable electronic device is shielded from signals in the outside environment and also cannot transmit signals to the outside environment. Thus, the user of the electronic device can use the enclosure 100 to shield the electronic device in such a way that the location of the device cannot be determined when the device is within the closed enclosure 100 and the device cannot be accessed by outside entities.

However, the user can selectively choose to shield the electronic device by moving the signal transfer element 110 between the retracted or deployed configuration. In this way, the user can selectively decide when to make their portable electronic device available to the outside system. Moreover, the positioning of the signal transfer element 110 provides a visual indication to the user as to the state of the enclosure whether it is receiving or blocking communications.

The enclosure 100 in FIGS. 1A-1D is illustrated as being a square box, however it will be appreciated that the enclosure 100 can have any of a number of different shapes without departing from the spirit of the present invention. Generally, the shield layer 118 is continuous throughout the entire interior surface of the enclosure 100 but small openings that are smaller than the wavelength of signal that the enclosure is designed to shield from can be made without affecting the shielding capabilities of the enclosure 100.

FIGS. 2A-2D illustrate another embodiment of a enclosure 200 that has a housing 202 with an interior space 104 and a access port 106 that can be moved between an open and closed position. In reference to FIGS. 2A-2C, components that are labeled the same as components labeled in FIGS. 1A-1D are substantially identical and perform substantially the same function.

Figure 2A:
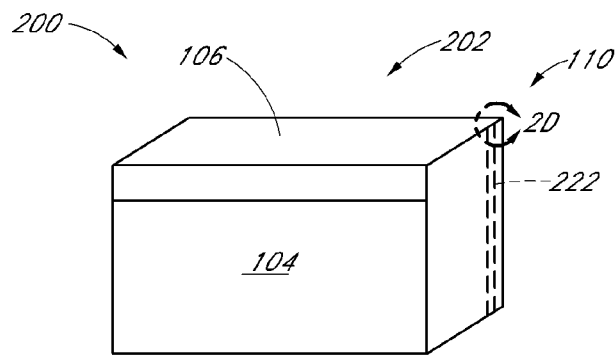
FIGS. 2A-2E are perspective and detailed views of another embodiment of a configurable shielded enclosure.
Figure 2B:
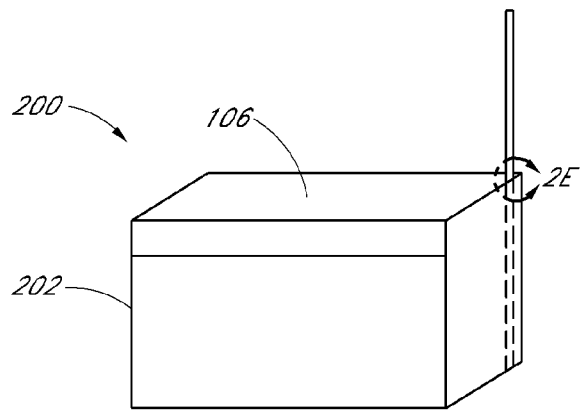
Figure 2C:
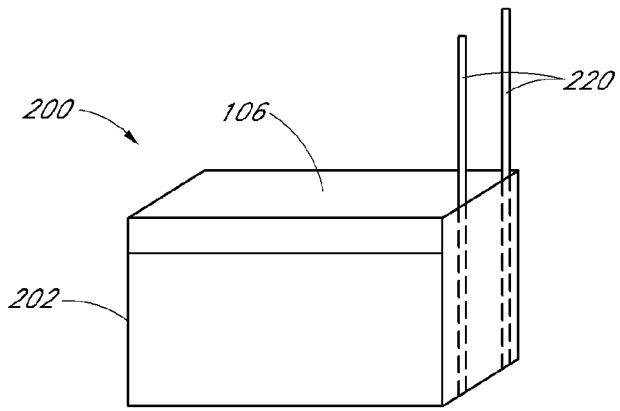

In FIG. 2A-2C, the signal transfer device 110 is comprised of one or more cylindrical antennas 220 that are positioned within a sheath 222 formed within the interior space 204 of the housing 202. The cylindrical antennas 220 are formed having a shaft 226 with first diameter that is smaller than the diameter of a circular opening 224 through which the antennas can be extended so that the antennas 220 can be electrically isolated from the shield layer 118.

Figure 2D:
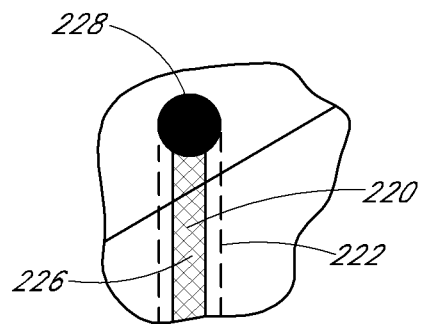
Figure 2E:
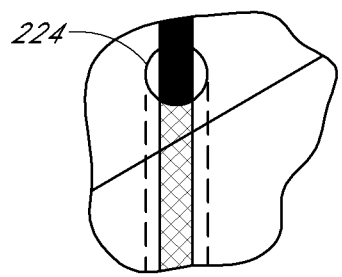

The cylindrical antennas include a button 228 on the upper surface that provides an access point for the user to grab to deploy the antenna. Further, as shown in FIG. 2D, the button 228 is preferably sized and the shield layer 118 adjacent the opening 224 is preferably exposed so that when the antenna 220 is retracted, the button contacts the shield layer 118 and thereby forms part of the faraday cage about the interior 104 of the enclosure to isolate the portable electronic device positioned therein. As shown in FIG. 2C, multiple antennas 220 may be used on a single enclosure 200.

FIGS. 3A-3D illustrate two additional embodiments of enclosures 300 and 300'. Again, parts that are substantially the same as described above in connection with FIGS. 1A-1D will be assigned the same reference numerals. As shown, the enclosure 300 of FIG. 3A and 300' of FIG. 3C have a housing 102 with an interior space 104, and an access port 106. The walls are also formed in substantially the same manner as described above.

In this embodiment, the signal transfer element 330 comprises a plurality of planar antennas 330 formed of a conductive material that can have different sizes so as to be able to transmit different wavelengths of signals to and from the interior space 104 of the enclosure 102 containing the portable electronic device. Preferably, the antennas have insulated wires or conductors that extend inward into the interior space so as to be able to transmit signals to and from the interior space but the conductors will also have to be insulated from the shield layer 118 for the same reasons as given above.

Figure 3A:
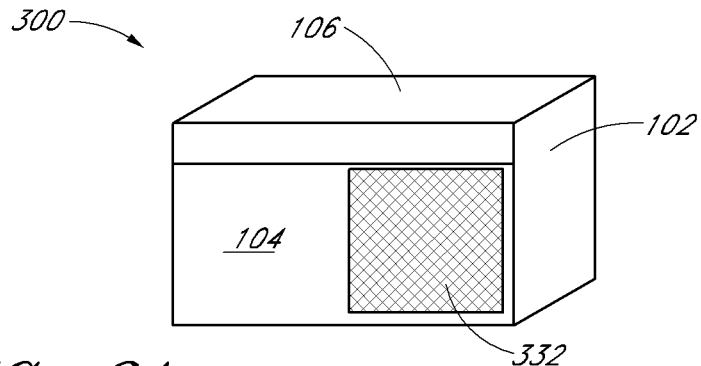
FIGS. 3A-3E are perspective and detailed views of two further embodiments of a configurable shielded enclosure.
Figure 3B:
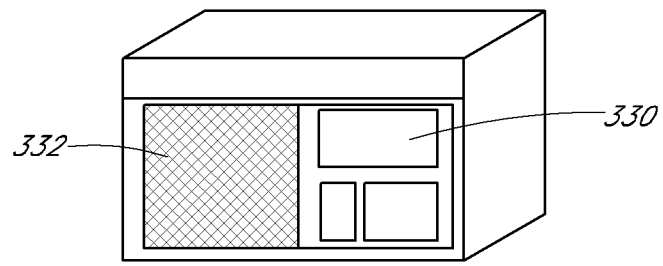

In the embodiment of FIGS. 3A, 3B, a movable shield layer 332 is movable between a first position where the antennas 330a are exposed and able to receive and transmit signals and a second position where the antennas 330a are covered by the shield layer 332 and are thus electrically isolated and unable to transmit or receive signals. The movable shield layer 332 is preferably electrically coupled with the shield layer 118 of the walls of the enclosure 102 so as to electrically isolate the interior space 104 of the housing 102 when in the closed position.

Figure 3C:
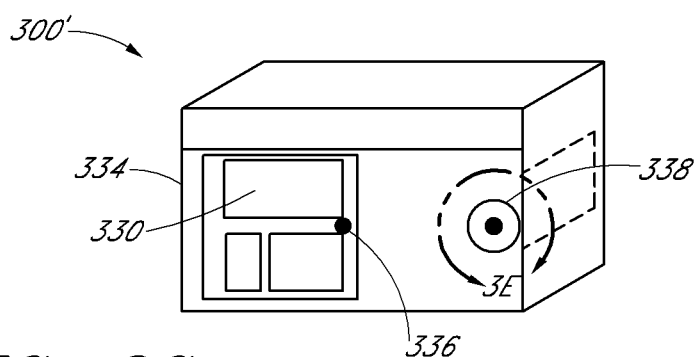
Figure 3D:
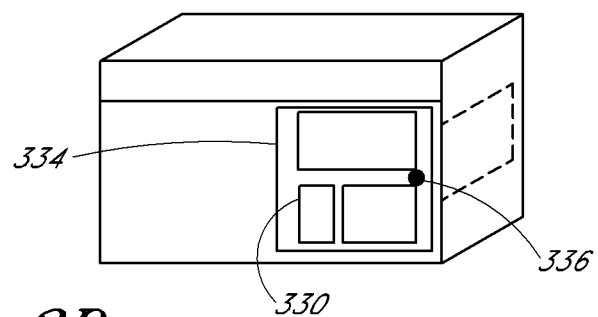
Figure 3E:
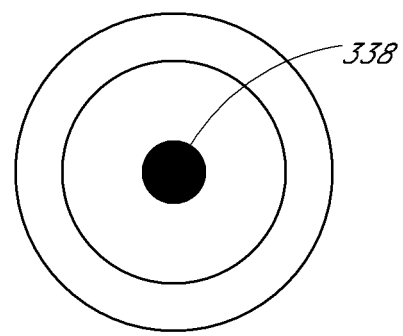

In the embodiment of FIGS. 3C and 3D, the antennas 330a are mounted on a movable member 334 that is mounted on outer surface of the housing 102 the enclosure 300' so as to be movable between a isolated position and a transmitting position. In the transmitting position shown in FIG. 3D, a contact button 336 on the movable member 334 that is electrically connected to the antennas 330a is electrically connected to a contact button 338 that then transmits signals to and from the interior space 104 of the enclosure 300'. By positioning the moveable member 334, the user can selectively allow communications or disallow communications with a portable communication device positioned inside the enclosure 300'.

Figure 4A:
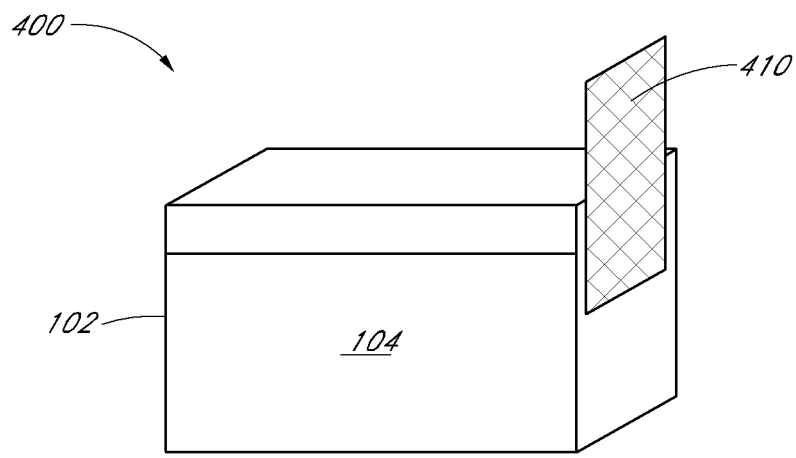
FIGS. 4A and 4B are perspective views of another embodiment of a configurable shielded enclosure.
Figure 4B:
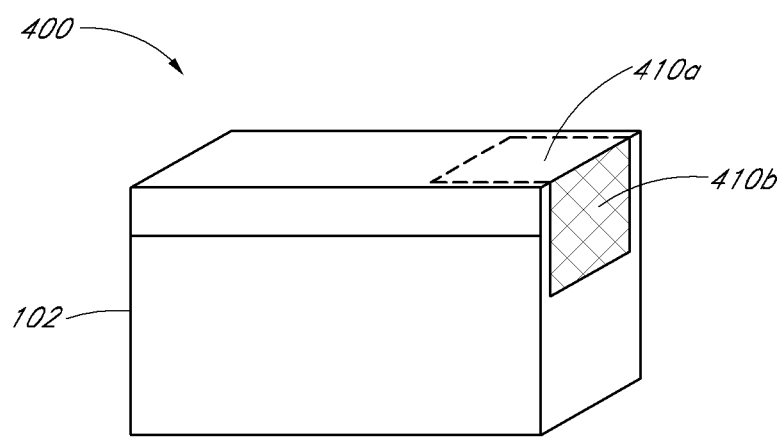

FIGS. 4A and 4B is another embodiment of an enclosure 400 that has a housing 102, with an interior space 104 accessed via an access port 106. In this embodiment, there is a signal transfer element 410 that is fixedly mounted to the outside of the housing 102 that has a fixed portion 410b and a movable portion 410a. The fixed portion 410b can be sewn or otherwise adhered to the outer surface of the housing and includes a metallic or conductive layer that can function as an antenna.

The movable portion 410a is preferably flexible, as described above in conjunction with the embodiment referenced in FIGS. 1A-1E, and can be positioned inside the space 104 via the access port 106 with the port 106 then shut in the manner shown in FIG. 4B. In this configuration communications with a portable electronic device positioned within the housing can be maintained. In the configuration of FIG. 4A, the movable portion 410a of the signal transfer element 410 can be removed and the portable electronic device is then isolated by the shield layer 118 in the same manner as described above in conjunction with the embodiment of FIGS. 1A-1E.

In each of the preceding embodiments, the housing 102 is illustrated as having a generally box shape. It will be appreciated that the actual shape of the housing is immaterial to the operation of the embodiments of this invention and can have any shape so long as it provides the isolation effect needed to selectively prevent or inhibit transmission between the portable electronic device and the outside environment.

Figure 5A:
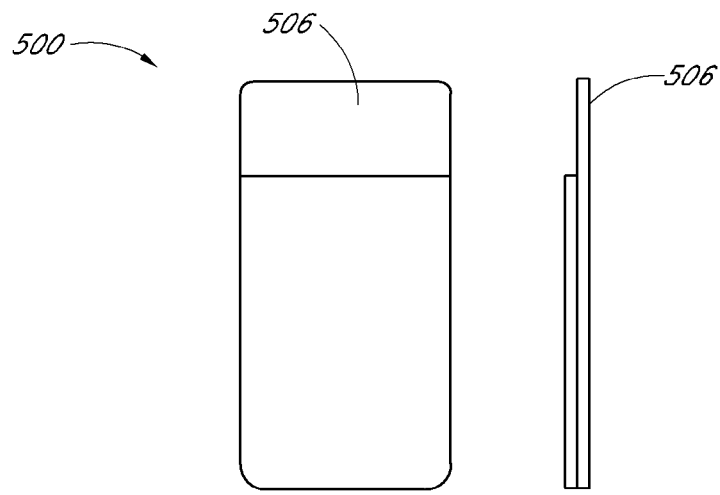
FIGS. 5A-5C are perspective views of a pouch-type embodiment configurable shielded enclosure.
Figure 5B:
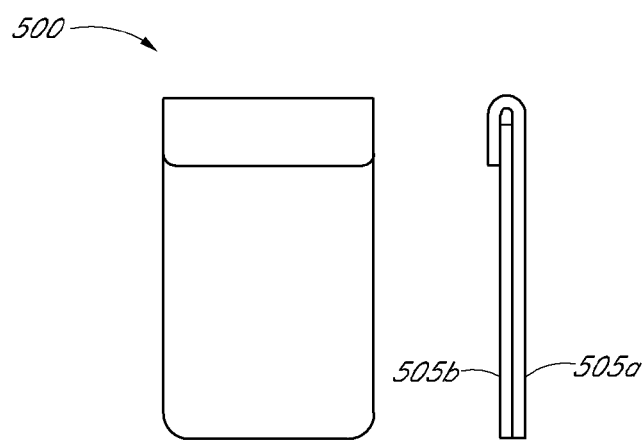
Figure 5C:
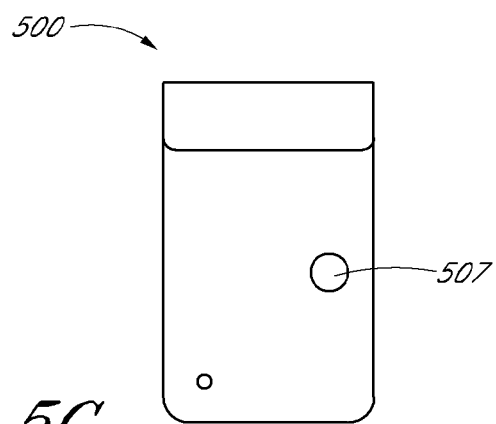

For example, FIGS. 5A-5C illustrate an embodiment of an enclosure 500 that has a different shape. In this embodiment, the housing 102 comprises a pouch shape that defines an interior space 104 that may be narrowly tailored to receive a relatively flat portable electronic device such as, for example, a smart phone. The access port 106 may comprise a flap 506 that is preferably radiused so as to inhibit wavelength transmission through an opening 508 between flap 506 and the housing 102. The housing 102 and the flap 506 may be made of the same multi-layer structure of the walls described above and include the shield layer 118 so that the faraday cage isolation is maintained when the flap 506 is in it's closed position shown in FIG. 5B.

As shown in FIGS. 5A and 5B, there are two walls 505a and 505b that comprise the housing 102. The two walls 505a and 505b are connected to each other about the perimeter of the walls and the walls are flexible so as to be separable to receive the portable electronic device therebetween.

As shown in FIG. 5C, small generally circular openings 507 that are sized less than the wavelength of the communication signals being used with the portable electronic device may be formed in the housing 102 without affecting the isolation characteristics of the enclosure 500. These openings can be used for other access purposes the portable electronic device such as for attaching chargers or other communication cables that are not radiating.

Figure 6A:
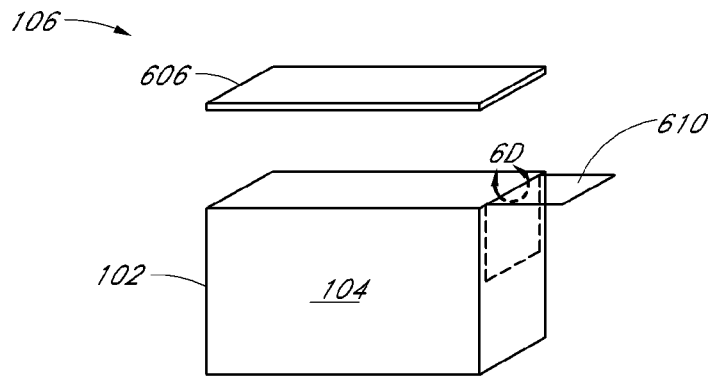
FIGS. 6A-6D are perspective and detailed views of further embodiments of a configurable shielded enclosure.
Figure 6B:
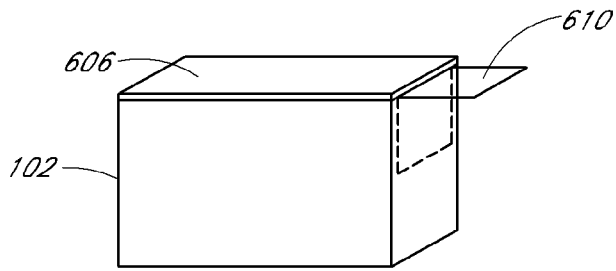
Figure 6C:
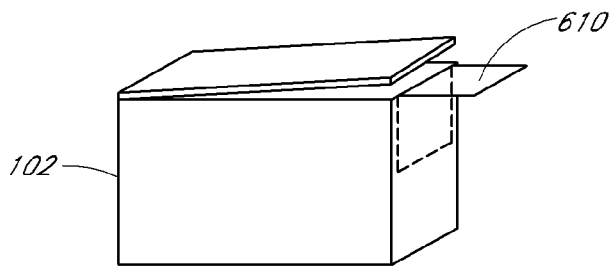

FIG. 6A-6C illustrate another embodiment 600 of an enclosure that has a housing 102 that defines an interior space 104 and an access port 106 that is formed of either a fully or partially removable cover 606. The enclosure 600 includes a signal transfer element 610 that is partly positioned on the outside of the housing 102 and has a conductive surface adjacent and edge of the housing 102.

The cover 606 also includes a shield layer 118 that is exposed and can contact the signal transfer element 610 and also the shield layer 118 in the other walls of the housing 102. When the cover 610 is positioned on the housing 102 in the manner shown in FIG. 6B, the signal transfer element 610 is at the same electrical potential as the shield layer 118 via the contact with the portion of the shield layer 118 and thus part of the shielding of the interior space 104 of the housing 102.

Figure 6D:
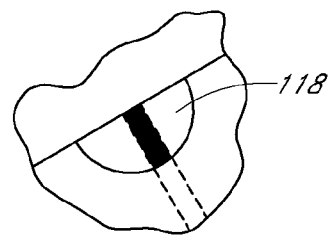

When the cover 606 is fully removed from the housing 102 in the manner shown in FIG. 6A, communication between the portable electronic device and the outside world can be provided via the opening and the signal transfer element 610 may comprise an antenna that enhances this communication. Moreover, when the cover 606 is partially removed in the manner shown in FIG. 6C, the signal transfer element 610 forms a slot antenna that permits radiation to be transmitted into and out of the interior space 104 of the enclosure 600. FIG. 6D illustrates that the conductive layer of the signal transfer element 610 as well as the shield layer 118 cover 606 may be partially exposed.

The foregoing has illustrated a plurality of different enclosures that can be configured by a user of a portable electronic device to permit or inhibit communication, such as via electromagnetic signals or light signals etc. by positioning a signal transfer element into a configuration where it can transfer signals between the interior of the enclosure and the outside world and configurations where it can. In this way, the user of the portable electronic device can selectively permit or restrict access to the device and block information, such as location information from being accessible by others.

Although the foregoing description has shown, illustrated and described various embodiments of the present invention, it will be apparent that various changes to the form and use of the present invention may be made by those skilled in the art without departing from the spirit or scope of the present invention. Hence, the scope of the present invention should not be limited to the foregoing discussion but should be defined by the appended claims.

What is claimed is:

1. An enclosure for a communications device that receives and/or sends signals, the enclosure defining a space that receives the communications device wherein the enclosure further defines shielding that surrounds the communications device when it is positioned within the space, wherein the enclosure has a single transfer element that has a receiving configuration wherein signals can be received and sent by the communications device when positioned within the space and a blocked configuration wherein signals can neither be sent to nor received from the communications device when positioned within the space wherein the enclosure defines an aperture that can be opened in the receiving configuration or closed in the blocked configuration.

2. The enclosure of claim 1 wherein one or more layers of the enclosure is conductive to radio frequency signals and defines a faraday cage about the space.

3. The enclosure of claim 1 wherein the enclosure is formed of materials that are conductive to RF signals and are selected from the group comprised of metal, metalized substrates, woven materials and fabric combinations.

4. The enclosure of claim 1, wherein the aperture can be opened an amount selected to form a slot antenna in the receiving configuration.

5. The enclosure of claim 1, wherein the enclosure includes at least one signal transfer element that can expose the communications device to RF signals in the receiving configuration and isolate the contained device in the blocked configuration.

6. The enclosure of claim 1, wherein the enclosure includes at least one signal transfer element that can be exposed to RF signals in the receiving configuration or positioned within the space defined by the shield in the blocked configuration.

7. The enclosure of claim 1, wherein the signal transfer element is formed of one or more conductive elements.

8. The enclosure of claim 7, wherein the signal transfer element is wire, microstrip, or stripline.

9. The enclosure of claim 8, wherein the signal transfer element comprises an antenna.

10. The enclosure of claim 9, wherein the antenna is a device selected from the group of antennas comprising monopole, dipole, strip-line, or fractal.

11. The enclosure of claim 1, wherein the signal transfer element is at least partially formed within the shield comprising the faraday cage.

12. The enclosure of claim 1, wherein the signal transfer element is configured so as to provide a visual signal to the user indicative of whether the enclosure is in the receiving or blocked configuration.

13. The enclosure of claim 1, wherein the signal transfer element comprises a flap that is either exposed in the receiving configuration or unexposed in the blocked configuration.

14. An enclosure for housing a personal electronic device, the enclosure comprising:
   a housing that defines an interior space, wherein the walls of the housing include a shield layer formed of a conductive material that isolates the interior space from communicating outside of the interior space, and wherein the interior space is dimensioned to receive a portable electronic device;
   an access port that permits selective access into the interior space, wherein the access port has an open and a closed configuration;
   a signal transfer element that is part of the housing and has a transmitting and an isolating configuration, wherein the signal transfer element in the transmitting configuration provides signals to and from the interior space of the housing and in the isolating configuration inhibits transmission of signals to and from the interior space to the exterior of the interior space.

15. The enclosure of claim 14, wherein the housing is in the form of either a box or a pouch.

16. The enclosure of claim 14, wherein the walls of the housing and of the access port include a shield layer formed of a material that will isolate the interior space from communication signals.

17. The enclosure of claim 16, wherein the shield layer is a metallic layer that isolates the interior space from RF communication signals.

18. The enclosure of claim 14, wherein the signal transfer element comprises a conductive element that has an exterior portion that is positionable both outside of the interior space so that the exterior portion transmits signals to and from the portable electronic device and inside the interior space so that the signal transfer element is blocked from receiving or transmitting to and from the portable electronic device and an interior portion that is positioned inside the interior space so as transmit signal to and from the portable electronic device when the exterior portion is positioned outside of the interior space.

19. The enclosure of claim 18, wherein the signal transfer element comprises a flexible element having a metallic foil.

20. The enclosure of claim 14, wherein the signal transfer element comprises a conductive element that has an exterior portion that is positioned outside of the interior space and an interior portion that is positionable both inside of the interior space and outside of the interior space so that when the interior portion is inside the interior space the signal transfer element transmits signals to and from to the portable electronic device and so that when the interior portion is outside of the interior space, the signal transfer element is prevented from transmitting signals to and from the portable electronic device.

21. The enclosure of claim 20, wherein the signal transfer element comprises a flexible element having a metallic foil.

22. The enclosure of claim 14, wherein the signal transfer element comprises at least one cylindrical antenna that is extendable outside of the interior space of the housing so as to receive and transmit to and from the portable electronic device.

23. The enclosure of claim 22, wherein the antenna includes a button that engages with the shield layer of the housing when retracted into the housing so that the antenna is maintained at the same electrical potential as the shield layer when retracted.

24. The enclosure of claim 14, wherein the signal transfer element comprises at least one planar antenna that is mounted on a movable member positioned on the exterior of the housing and wherein the movable member is movable between an isolation position where the signal transfer element is isolated from the portable electronic device and a transmission position wherein the at least one planar antenna can transmit and receive signals to and from the portable electronic device within the housing.

25. The enclosure of claim 24, wherein the movable member and the housing include a connection point that physically interconnect and permit communications between the at least one antenna and the portable electronic device within the interior space of the housing when the movable member is positioned in the transmission position.

26. The enclosure of claim 14, wherein the signal transfer element comprises at least one planar antenna that is mounted on an exterior surface of the housing, wherein the at least one planar antenna includes a transmitting component that extends into the interior space so as to permit communications to and from the portable electronic device in the interior space and wherein the enclosure further comprises a movable shield member that is movable between a transmit location where the at least one antenna is exposed to the outside and a isolate location where the at least one antenna is isolated from the outside.

27. The enclosure of claim 14, wherein the access port comprises a removable cover with a shield layer and wherein the removable cover, when positioned on the housing, the shield layer of the removable cover electrically contacts a portion of the signal transfer element so that the signal transfer element is isolated from the personal electronic device and wherein when the removable cover is removed from the housing so as to be electrically disconnected from the signal transfer element, the signal transfer element can communicate signals to and from the portable electronic device positioned within the housing.

28. A method of selectively allowing communications with a portable electronic device, the method comprising:
   positioning the portable electronic device within a portable shielded space;
   configuring the shielded space to permit communications to and from the portable electronic device by positioning a signal transfer element that is part of the housing that defines the portable shielded space in an orientation so as to receive and transmit communications; and
   configuring the shielded space to prevent communications to and from the portable electronic device by positioning the signal transfer element into an orientation so that the signal transfer element does not receive and transmit communications wherein positioning the portable electronic device within a portable shielded space comprises positioning device within an enclosure having an access port wherein the enclosure and access port defines a faraday cage when the access port is in a closed position.

29. The method of claim 28, wherein configuring the shielded space to permit communications comprises positioning a signal transfer element so that a portion of the signal transfer element extends out of the shielded space to receive and transmit signals.

\* \* \* \* \*